US012737512B2

(12) United States Patent
Katsuta et al.

(10) Patent No.: US 12,737,512 B2
(45) Date of Patent: Sep. 15, 2026

(54) SIMULATION METHOD, SIMULATION APPARATUS, FILM FORMING APPARATUS, ARTICLE MANUFACTURING METHOD AND NON-TRANSITORY STORAGE MEDIUM

(71) Applicant: CANON KABUSHIKI KAISHA, Tokyo (JP)

(72) Inventors: Ken Katsuta, Saitama (JP); Sentaro Aihara, Tochigi (JP); Yuichiro Oguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1385 days.

(21) Appl. No.: 17/375,076

(22) Filed: Jul. 14, 2021

(65) Prior Publication Data

US 2022/0035968 A1 Feb. 3, 2022

(30) Foreign Application Priority Data

Jul. 29, 2020 (JP) ................................ 2020-128507

(51) Int. Cl.
*G06F 30/20* (2020.01)
*G03F 7/00* (2006.01)
*G06F 30/28* (2020.01)

(52) U.S. Cl.
CPC ............ *G06F 30/20* (2020.01); *G03F 7/0002* (2013.01); *G06F 30/28* (2020.01)

(58) Field of Classification Search
CPC ...... G06F 30/20; G06F 30/28; G06F 2113/18; G03F 7/0002; G03F 7/7035; G03F 7/705
(Continued)

(56) References Cited

U.S. PATENT DOCUMENTS 9,201,990 B2 * 12/2015 Wakamatsu .......... G03F 7/0002
2007/0118341 A1 5/2007 Tamaoki et al.
(Continued)

FOREIGN PATENT DOCUMENTS

CN 103317713 A 9/2013
CN 106414772 A 2/2017
(Continued)

OTHER PUBLICATIONS

Liang et al., Air bubble formation and dissolution in dispensing nanoimprint lithography, 2007, Nanotechnology 18 025303, 7 pages.*
(Continued)

*Primary Examiner* — Juan C Ochoa
(74) *Attorney, Agent, or Firm* — ROSSI, KIMMS & McDOWELL LLP

(57) ABSTRACT

The present invention provides a simulation method of predicting a behavior of a curable composition in a process of bringing a plurality of droplets of the curable composition arranged on a first member into contact with a second member and forming a film of the curable composition in a space between the first member and the second member, the method including determining a second range for executing second simulation for predicting the behavior with second accuracy higher than first accuracy, the second range being included in a first range for executing first simulation for predicting the behavior with the first accuracy and the second range being smaller than the first range, executing the second simulation in the second range, and displaying a result of the second simulation executed in the second range.

17 Claims, 8 Drawing Sheets

(58) Field of Classification Search
USPC .......................................................... 703/2, 6
See application file for complete search history.

(56) References Cited

U.S. PATENT DOCUMENTS

| | | | |
|---|---|---|---|
| 2010/0321478 A1 | 12/2010 | Sliwa et al. | |
| 2012/0083667 A1 | 4/2012 | Isogai et al. | |
| 2012/0120163 A1 | 5/2012 | Ellinger | |
| 2012/0221302 A1 | 8/2012 | Lewandowski et al. | |
| 2014/0131313 A1 | 5/2014 | Wakamatsu et al. | |
| 2014/0314991 A1 | 10/2014 | Smith et al. | |
| 2017/0285463 A1* | 10/2017 | Ito | C09D 133/06 |
| 2017/0285479 A1 | 10/2017 | Stachowiak et al. | |
| 2018/0208635 A1 | 7/2018 | Zouani | |
| 2020/0004139 A1 | 1/2020 | Sato et al. | |
| 2020/0394346 A1 | 12/2020 | Asano et al. | |
| 2020/0394349 A1 | 12/2020 | Asano et al. | |

FOREIGN PATENT DOCUMENTS

| | | |
|---|---|---|
| CN | 106777753 A | 5/2017 |
| CN | 109311956 A | 2/2019 |
| CN | 109782548 A | 5/2019 |
| CN | 110852005 A | 2/2020 |
| JP | H10124567 A | 5/1998 |
| JP | 2010067029 A | 3/2010 |
| JP | 2012212833 A | 11/2012 |
| JP | 2013161893 A | 8/2013 |
| JP | 2014081900 A | 5/2014 |
| JP | 5599356 B2 | 10/2014 |
| JP | 2014211440 A | 11/2014 |
| JP | 2016146089 A | 8/2016 |
| JP | 2017163040 A | 9/2017 |
| JP | 6498343 B2 | 4/2019 |
| KR | 101492063 B1 | 2/2015 |
| TW | 201144088 A | 12/2011 |
| TW | 201243490 A | 11/2012 |
| TW | 201429721 A | 8/2014 |

OTHER PUBLICATIONS

Office Action issued in Chinese Appln. No. 202110841384.X mailed on Dec. 19, 2024. English translation provided.
Office Action issued in Taiwanese Appln. No. 110126053 dated Jan. 6, 2025. English translation provided.
Office Action issued in U.S. Appl. No. 17/375,117 mailed on Jan. 16, 2025.
Office Action issued in U.S. Appl. No. 17/375,117 mailed on Jun. 8, 2023.
Grimmer et al. "Simulation before fabrication: a case study on the utilization of simulators for the design of droplet microfluidic networks" RSC Advances. 2018: 34733-34742.
Fan et al. "Modeling universal dynamics of cell spreading on elastic substrates" Biomech Model Mechanobiol. 2015: pp. 1265-1280.
Office Action issued in U.S. Appl. No. 17/375,117, mailed Jan. 11, 2024.
Copending U.S. Appl. No. 17/375,117, filed Jul. 14, 2021.
Office Action issued in Taiwanese Appln. No. 110125239 dated Apr. 28, 2023. English translation provided.
Office Action issued in Taiwanese Appln. No. 110126053, mailed May 9, 2024. English translation provided.
Office Action issued in Chinese Appln. No. 202110854290.6, mailed on Mar. 7, 2025.
Office Action issued in U.S. Appl. No. 17/375,117 mailed Jul. 28, 2025.
Office Action issued in Chinese Appln. No. 202110854290.6 mailed Aug. 27, 2025.
Office Action issued in U.S. Appl. No. 17/375,117 mailed on Nov. 12, 2025.

* cited by examiner

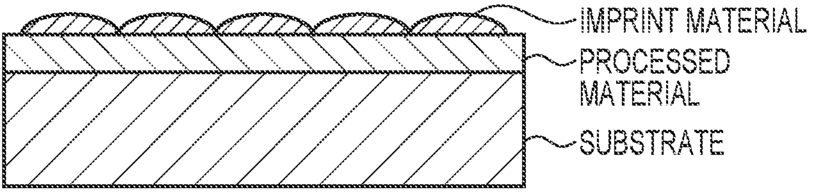
FIG. 8B
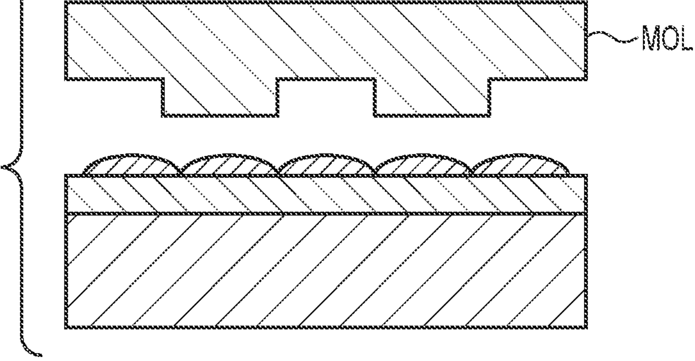
FIG. 8C
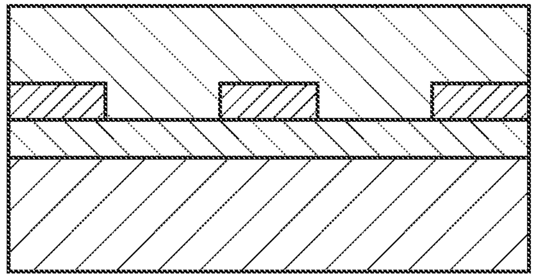
FIG. 8D
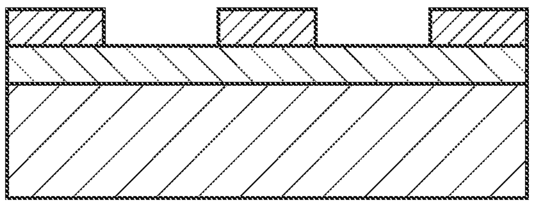
FIG. 8E
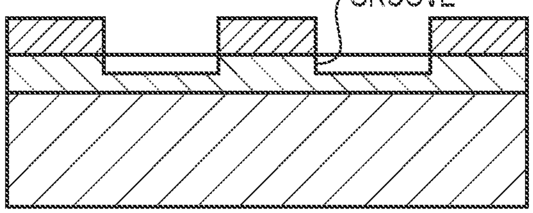
FIG. 8F
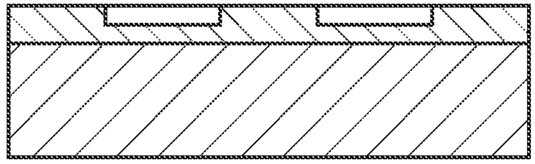

SIMULATION METHOD, SIMULATION APPARATUS, FILM FORMING APPARATUS, ARTICLE MANUFACTURING METHOD AND NON-TRANSITORY STORAGE MEDIUM

BACKGROUND OF THE INVENTION

Field of the Invention

The present invention relates to a simulation method, a simulation apparatus, a film forming apparatus, an article manufacturing method, and a non-transitory storage medium.

Description of the Related Art

There is provided a film forming technique of forming a film made of a cured product of a curable composition on a substrate by arranging the curable composition on the substrate, bringing the curable composition into contact with a mold, and curing the curable composition. Such film forming technique is applied to an imprint technique and a planarization technique. In the imprint technique, by using a mold having a pattern, the pattern of the mold is transferred to a curable composition on a substrate by bringing the curable composition on the substrate into contact with the pattern of the mold and curing the curable composition. In the planarization technique, by using a mold having a flat surface, a film having a flat upper surface is formed by bringing a curable composition on a substrate into contact with the flat surface and curing the curable composition.

The curable composition is arranged in the form of droplets on the substrate, and the mold is then pressed against the droplets of the curable composition. This spreads the droplets of the curable composition on the substrate, thereby forming a film of the curable composition. At this time, it is important to form a film of the curable composition with a uniform thickness and not to leave bubbles in the film. To achieve this, the arrangement of the droplets of the curable composition, a method and a condition for pressing the mold against the curable composition, and the like are adjusted. To implement this adjustment operation by trial and error using an apparatus, enormous time and cost are required. To cope with this, development of a simulator that supports such adjustment operation is desired.

Japanese Patent No. 5599356 discloses a simulation method for predicting wet spreading and gathering (merging of droplets) of a plurality of droplets arranged on a pattern forming surface. In this simulation method, the amount of computation is reduced by predicting the spread shape of each droplet of the curable composition on the substrate.

In an imprint process, when droplets of a curable composition are wet-spread and form a film, if a bubble is left in the film, the portion (unfilled portion) where the bubble is left becomes a defect. In order to reduce occurrence of defects, it is effective to predict generation of bubbles by simulation. In order to predict the generation of bubbles, fluid computation considering the local shapes of the mold and the substrate and considering the interaction of droplets is required.

However, such simulation requires a high computational load, resulting in an increase in computational cost. As a countermeasure for the simulation with a high computational cost, it is conceivable to execute computation while limiting (specifying) the computational region, thereby reducing the overall computational cost. However, the effect obtained by limiting the computational region is greatly influenced by the ability (capability) of the user (operator) who limits the computational region. For example, due to a user's mistake, the computation may be redone and the computational cost may increase.

SUMMARY OF THE INVENTION

The present invention provides a simulation method that can reduce the computational cost while maintaining the simulation accuracy.

According to one aspect of the present invention, there is provided a simulation method of predicting a behavior of a curable composition in a process of bringing a plurality of droplets of the curable composition arranged on a first member into contact with a second member and forming a film of the curable composition in a space between the first member and the second member, the method including determining a second range for executing second simulation for predicting the behavior with second accuracy higher than first accuracy, the second range being included in a first range for executing first simulation for predicting the behavior with the first accuracy and the second range being smaller than the first range, executing the second simulation in the second range, and displaying a result of the second simulation executed in the second range, wherein in the determining, the second range is determined based on at least one piece of information among design information of the first member, design information of the second member, arrangement information of the plurality of droplets of the curable composition, positional information of a contact surface of the second member that contacts the plurality of droplets of the curable composition, and information about a result of the first simulation executed in the first range.

Further aspects of the present invention will become apparent from the following description of exemplary embodiments with reference to the attached drawings.

BRIEF DESCRIPTION OF THE DRAWINGS

FIG. 8A to FIG. 8F are views for describing an article manufacturing method.

DESCRIPTION OF THE EMBODIMENTS

Figure 1:
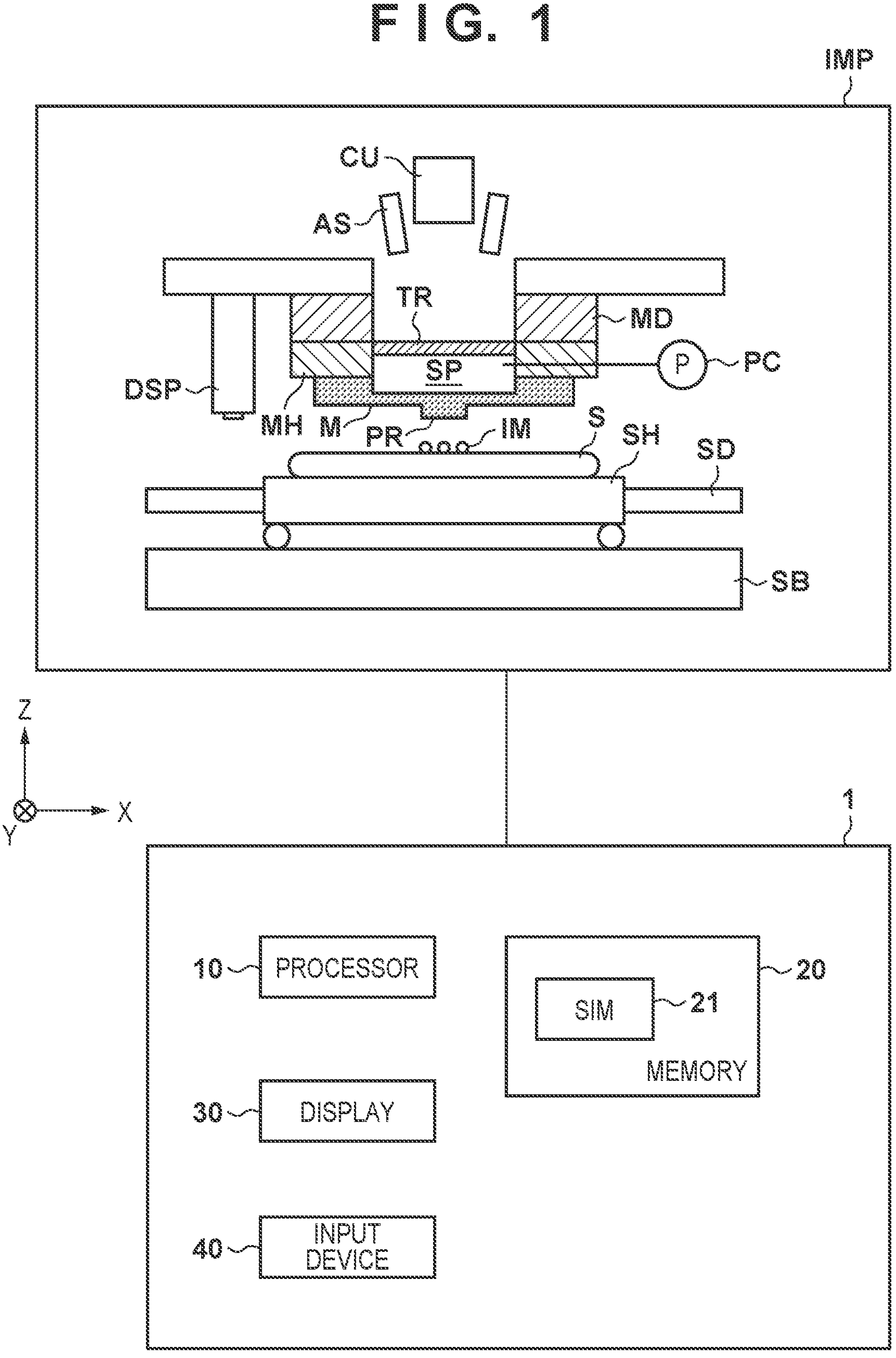
FIG. 1 is a schematic view showing the arrangements of a film forming apparatus and a simulation apparatus according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangements of a film forming apparatus IMP and a simulation apparatus 1 according to an embodiment of the present invention. The film forming apparatus IMP executes a process of bringing a plurality of droplets of a curable composition IM arranged on a substrate S into contact with a mold M and forming a film of the curable composition IM in a space between the substrate S and the mold M. The film forming apparatus IMP may be formed as, for example, an imprint apparatus or a planarization apparatus. The substrate S and the mold M are interchangeable, and a film of the curable composition IM may be formed in the space between the mold M and the substrate S by bringing a plurality of droplets of the curable composition IM arranged on the mold M into contact with the substrate S. Therefore, the film forming apparatus IMP is comprehensively an apparatus that executes a process of bringing a plurality of droplets of the curable composition IM arranged on the first member into contact with the second member and forming a film of the curable composition IM in a space between the first member and the second member. This embodiment provides a description by assuming the first member as the substrate S and the second member as the mold M. However, the first member may be assumed as the mold M and the second member may be assumed as the substrate S. In this case, the substrate S and the mold M in the following description are interchanged.

The imprint apparatus uses the mold M having a pattern to transfer the pattern of the mold M to the curable composition IM on the substrate S. The imprint apparatus uses the mold M having a pattern region PR provided with a pattern. As an imprint process, the imprint apparatus brings the curable composition IM on the substrate S into contact with the pattern region PR of the mold M, fills, with the curable composition IM, a space between the mold M and a region where the pattern of the substrate S is to be formed, and then cures the curable composition IM. This transfers the pattern of the pattern region PR of the mold M to the curable composition IM on the substrate S. For example, the imprint apparatus forms a pattern made of a cured product of the curable composition IM in each of a plurality of shot regions of the substrate S.

As a planarization process, using the mold M having a flat surface, the planarization apparatus brings the curable composition IM on the substrate S into contact with the flat surface of the mold M, and cures the curable composition IM, thereby forming a film having a flat upper surface. If the mold M having dimensions (size) that cover the entire region of the substrate S is used, the planarization apparatus forms a film made of a cured product of the curable composition IM on the entire region of the substrate S.

As the curable composition, a material to be cured by receiving curing energy is used. As the curing energy, an electromagnetic wave or heat can be used. The electromagnetic wave includes, for example, light selected from the wavelength range of 10 nm (inclusive) to 1 mm (inclusive) and, more specifically, infrared light, a visible light beam, or ultraviolet light. The curable composition is a composition cured by light irradiation or heating. A photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The viscosity (the viscosity at 25° C.) of the curable composition is, for example, 1 mPa·s (inclusive) to 100 mPa·s (inclusive).

As the material of the substrate, for example, glass, a ceramic, a metal, a semiconductor, a resin, or the like is used. A member made of a material different from the substrate may be provided on the surface of the substrate, as needed. The substrate includes, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and an orientation is information that is specified by values on the θX-, θY-, and θZ-axes. Positioning means controlling the position and/or orientation.

The film forming apparatus IMP includes a substrate holder SH that holds the substrate S, a substrate driving mechanism SD that moves the substrate S by driving the substrate holder SH, and a base SB that supports the substrate driving mechanism SD. In addition, the film forming apparatus IMP includes a mold holder MH that holds the mold M and a mold driving mechanism MD that moves the mold M by driving the mold holder MH.

The substrate driving mechanism SD and the mold driving mechanism MD form a relative movement mechanism that moves at least one of the substrate S and the mold M so as to adjust the relative position between the substrate S and the mold M. Adjustment of the relative position between the substrate S and the mold M by the relative movement mechanism includes driving to bring the curable composition IM on the substrate S into contact with the mold M and driving to separate the mold M from the cured curable composition IM on the substrate S. In addition, adjustment of the relative position between the substrate S and the mold M by the relative movement mechanism includes positioning between the substrate S and the mold M. The substrate driving mechanism SD is configured to drive the substrate S with respect to a plurality of axes (for example, three axes including the X-axis, Y-axis, and θZ-axis, and preferably six axes including the X-axis, Y-axis, Z-axis, θX-axis, θY-axis, and θZ-axis). The mold driving mechanism MD is configured to drive the mold M with respect to a plurality of axes (for example, three axes including the Z-axis, θX-axis, and θY-axis, and preferably six axes including the X-axis, Y-axis, Z-axis, θX-axis, θY-axis, and θZ-axis).

The film forming apparatus IMP includes a curing unit CU for curing the curable composition IM with which the space between the substrate S and the mold M is filled. For example, the curing unit CU cures the curable composition IM on the substrate S by applying the curing energy to the curable composition IM via the mold M.

The film forming apparatus IMP includes a transmissive member TR for forming a space SP on the rear side (the opposite side of a surface opposing the substrate S) of the mold M. The transmissive member TR is made of a material that transmits the curing energy from the curing unit CU, and can apply the curing energy to the curable composition IM on the substrate S.

The film forming apparatus IMP includes a pressure control unit PC that controls deformation of the mold M in the Z-axis direction by controlling the pressure of the space SP. For example, when the pressure control unit PC makes the pressure of the space SP higher than the atmospheric pressure, the mold M is deformed in a convex shape toward the substrate S.

The film forming apparatus IMP includes a dispenser DSP for arranging, supplying, or distributing the curable composition IM on the substrate S. However, the substrate S on which the curable composition IM is arranged by another apparatus may be supplied (loaded) to the film forming apparatus IMP. In this case, the film forming apparatus IMP need not include the dispenser DSP.

The film forming apparatus IMP may include an alignment scope AS for measuring a positional shift (alignment error) between the substrate S (or the shot region of the substrate S) and the mold M.

The simulation apparatus 1 executes computation of predicting the behavior of the curable composition IM in a process executed by the film forming apparatus IMP. More specifically, the simulation apparatus 1 executes computation of predicting the behavior of the curable composition IM in the process of bringing the plurality of droplets of the curable composition IM arranged on the substrate S into contact with the mold M and forming a film of the curable composition IM in the space between the substrate S and the mold M.

The simulation apparatus 1 is formed by, for example, incorporating a simulation program 21 in a general-purpose or dedicated computer. Note that the simulation apparatus 1 may be formed by a PLD (Programmable Logic Device) such as an FPGA (Field Programmable Gate Array). Alternatively, the simulation apparatus 1 may be formed by an ASIC (Application Specific Integrated Circuit).

In this embodiment, the simulation apparatus 1 is formed by storing the simulation program 21 in a memory 20 in a computer including a processor 10, the memory 20, a display 30, and an input device 40. The memory 20 may be a semiconductor memory, a disk such as a hard disk, or a memory of another form. The simulation program 21 may be stored in a computer-readable memory medium or provided to the simulation apparatus 1 via a communication facility such as a telecommunication network.

A simulation method and a simulation apparatus according to the present invention relate to simulation of the behavior of a curable composition in a process of forming a film of the curable composition in a space between a substrate and a mold, for example, an imprint process. A simulation method executed by the simulation apparatus 1 in each embodiment will be more specifically described below.

First Embodiment

Figure 2:
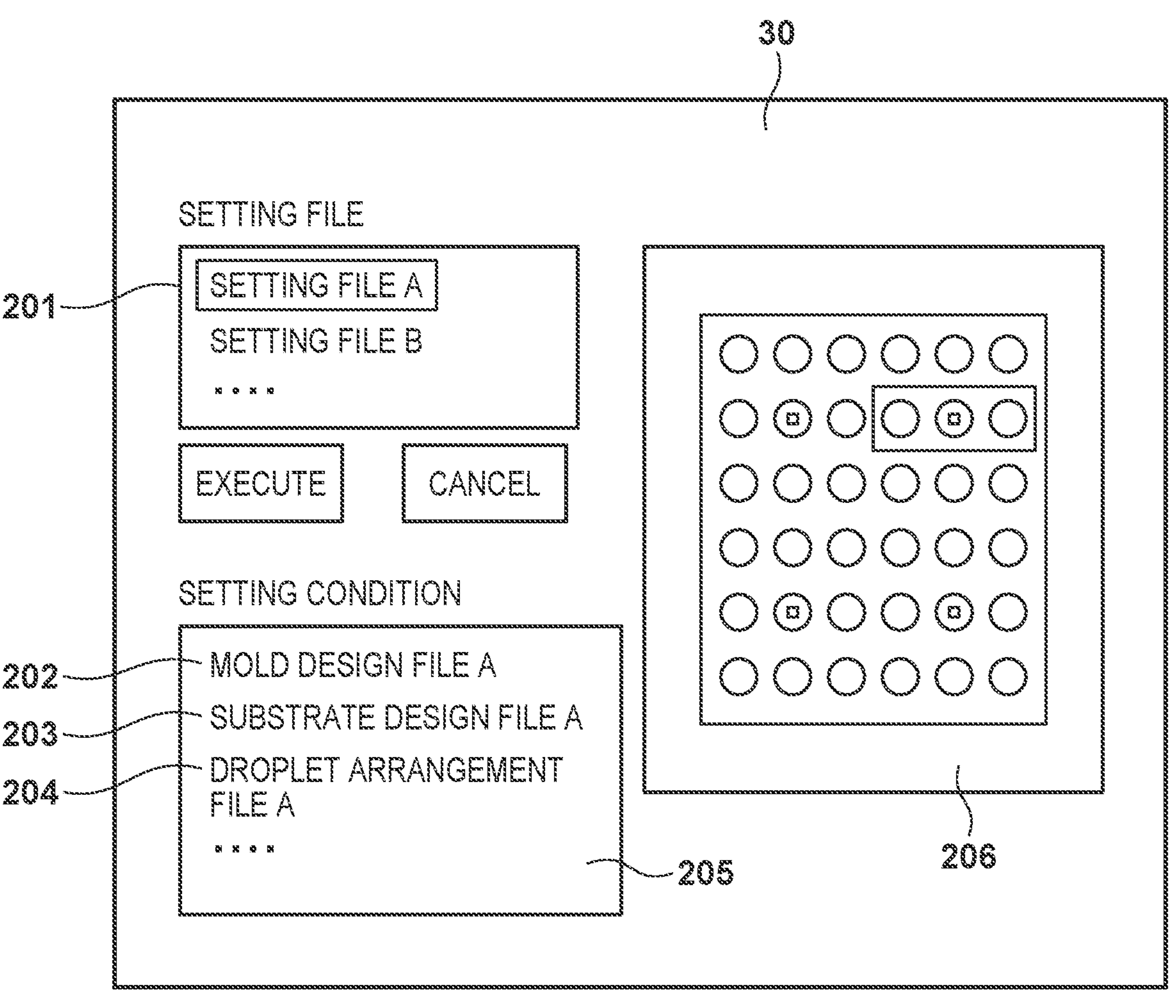
FIG. 2 is a view showing an example of a user interface provided on a display of the simulation apparatus.

FIG. 2 is a view showing an example of a user interface provided (displayed) on the display 30 of the simulation apparatus 1 in association with the simulation method according to the first embodiment. In this embodiment, as shown in FIG. 2, the simulation for predicting the behavior of the curable composition IM is executed by a user inputting necessary information via the input device 40 while referring to the user interface provided on the display 30.

For example, when a condition for simulation (to be referred to as a "simulation condition" hereinafter) is input, a setting file 201 is created in advance and stored in the memory 20. The setting file 201 is a file that integrates and manages conditions for an imprint process to be simulated. In the setting file 201, a mold design file 202 including the design information of the mold M, a substrate design file 203 including the design information of the substrate S, and a droplet arrangement file 204 indicating the discharge amounts and arrangement of droplets of the curable composition IM are designated as setting conditions.

Note that in this embodiment, for the sake of descriptive convenience, as the setting conditions concerning the conditions for the imprint process designated in the setting file 201, three specific files (the mold design file 202, the substrate design file 203, and the droplet arrangement file 204) are shown. However, a condition for the imprint process not shown in this embodiment may also be set as the setting condition, and a file thereof may be created and stored in the memory 20 to form a library.

Normally, the file stored in the memory 20 in advance is used as each file designated in the setting file 201. By storing a plurality of files in the memory 20 and forming a library as described above, setting of the analysis conditions can be facilitated. The file name of each file designated in the setting file 201 is displayed in a condition display window 205. The image information regarding the setting file 201 is displayed in a visual window 206 to prevent erroneous input of the setting file 201.

A simulation condition is also set in the setting file 201. For example, information related to imprinting, such as a force (pressing force) of pressing the mold M against the curable composition IM arranged on the substrate S and a time (filling time) of pressing the mold M against the curable composition IM, is set as the simulation condition.

The computational mode is also set in the setting file 201. The computational mode determines the steps of simulation. In accordance with the computational mode, simulation (computation in each step thereof) is executed.

Upon executing the simulation, the user (operator) checks the information displayed in the condition display window 205 and the information displayed in the visual window 206. If there is no problem with the information, for example, the user operates an execution button to execute the simulation.

A simulation result is displayed in the visual window 206. Note that the visual window 206 is not limited to the size, shape, and number shown in FIG. 2. The visual window 206 is displayed on the display 30 by freely changing the size, shape, and number thereof in accordance with the simulation result displayed therein.

Figure 3A:
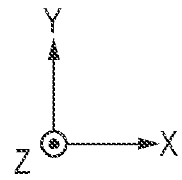
FIGS. 3A to 3C are views showing an outline of a simulation method according to the first embodiment.
Figure 3A:
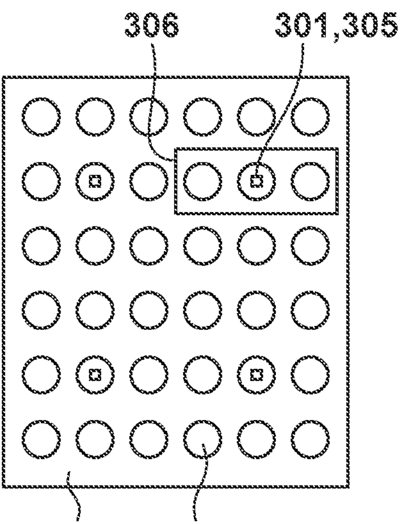
Figure 3B:
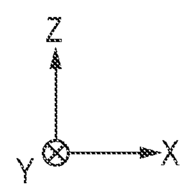
Figure 3B:
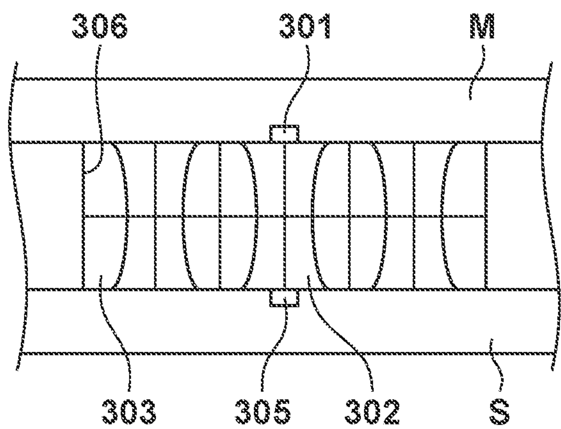
Figure 3C:
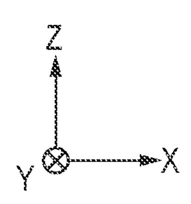
Figure 3C:
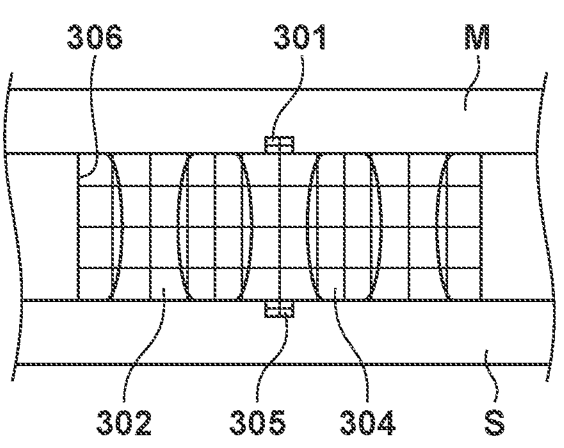

FIGS. 3A to 3C are views showing the outline of the simulation method according to this embodiment. With reference to FIGS. 3A to 3C, the simulation (computation method) in the simulation method according to this embodiment will be described. FIG. 3A shows a state in which the pattern region PR of the mold M and the substrate S are overlapped and viewed from the +Z direction. Each of FIGS. 3B and 3C shows a state in which a simulation range 306 to be described later is enlarged and viewed from the −Y direction. FIG. 3B shows the outline of the first simulation (computation method), and FIG. 3C shows the outline of the second simulation (computation method). Here, the pattern region PR of the mold M is the contact surface of the mold M which contacts the curable composition IM.

As shown in FIGS. 3A to 3C, a mold-side mark 301 is provided in the pattern region PR of the mold M. The mold-side mark 301 is a mark used for a plurality of applications such as positioning with respect to the substrate S and position measurement after the imprint process. For example, the mold-side mark 301 is a mark detected by a TTM (Through The Mold) alignment scope, and used for alignment between the mold M and the substrate S. Note that many marks and patterns are provided in the mold M, but illustration of the marks and patterns other than the mold-side mark 301 is omitted in FIGS. 3A to 3C.

A substrate-side mark 305 is provided in the substrate S. The substrate-side mark 305 is, for example, detected by the TTM alignment scope via the mold M, and used for alignment between the mold M and the substrate S. Note that many marks and patterns are provided in the substrate S, but illustration of the marks and patterns other than the substrate-side mark 305 is omitted in FIGS. 3A to 3C.

Droplets 302 of the curable composition IM are arranged between the mold M and the substrate S. The sizes and number of the droplets 302 shown in FIG. 3A are simplified for the sake of descriptive convenience. In practice, a lot of the droplets 302 are arranged between the mold M and the substrate S.

In this embodiment, two simulations different in the accuracy of predicting the behavior of the curable composition IM, that is, the first simulation and the second simulation are used. The first simulation is a simple computation method of predicting the behavior of the curable composition IM with the first accuracy, and the second simulation is a detailed computation method of predicting the behavior of the curable composition IM with the second accuracy higher than the first accuracy. The first simulation predicts (computes) the behavior of the curable composition IM using a first computational grid 303 as shown in FIG. 3B, and the second simulation predicts (computes) the behavior of the curable composition IM using a second computational grid 304 as shown in FIG. 3C. Here, each of the first computational grid 303 and the second computational grid 304 is an aggregate of computational components representing computational units. In FIGS. 3B and 3C, each of a plurality of minute rectangles arranged so as to form a grid is a computational component. In a general method, in order to analyze the behaviors of droplets 302 of the curable composition IM, a computational grid is defined, which is formed by computational components sufficiently smaller than the dimension of each droplet 302 of the curable composition IM. Then, the pattern information of the mold M corresponding to each computational component is extracted, and the behavior of the droplet 302 of the curable composition IM is represented as the ratio of the volume of the droplet 302 of the curable composition IM to the volume of each computational component.

The simulation range 306 indicates the range for executing the simulation. In this embodiment, in order to reduce the computational cost (computational load), the range for executing the simulation, that is, the simulation range 306 is limited. In this embodiment, the first simulation is assumed to use the entire pattern region PR of the mold M as the simulation range. However, for illustrative convenience, the simulation range 306 will be described as the range for executing the first simulation.

Since the first simulation is a simple computation method, the number of computational components in the computational grid defined in the simulation range 306 is smaller than that for the second simulation. For example, when the fluid behavior is simplified and computed by regarding the droplet 302 as one pillar connecting the mold M and the substrate S, the number of computational components in the first computational grid 303 used for the simulation may be relatively small. Further, in the first simulation, in order to simplify the computation, the computational grid defined in each of the mold-side mark 301 and the substrate-side mark 305, which are minute spaces, is omitted in the computation. In the first simulation, the computational cost is reduced by suppressing the number of computational components of the computational grids to be small. Thus, it is possible to perform computation while setting the simulation range to a region (the entire pattern region PR of the mold M) where the plurality of droplets of the curable composition IM are arranged on the substrate S.

The second simulation is a detailed computation method, and assumed to compute the fluid behavior in which the droplets 302 of the curable composition IM are connected. For example, when the fluid behavior of the droplets 302 in the space between the mold M (pattern region PR thereof) and the substrate S is computed, a relatively large number of computational components of the computational grid should be defined in the space between the mold M and the substrate S. Further, when the behavior (filling) of the droplet 302 entering the mold-side mark 301 is computed, it is also required to define the computational grid in the mold-side mark 301.

The mold-side mark 301 is formed by a concave portion. When the mold-side mark 301 is filled with the curable composition IM, a convex portion corresponding to the mold-side mark 301 is formed in a film of the curable composition IM after the imprint process. The diameter of the droplet 302 is about several hundred μm. On the other hand, the line width of the mold-side mark 301 ranges from several μm to several tens of μm. Thus, the space of the mold-side mark 301 (concave portion) is very small. Accordingly, when the fillability of the curable composition IM in the mold-side mark 301 is computed, it is necessary to define small computational components in the mold-side mark 301 and the space between the substrate S and the mold M. In other words, the number of computational components of the second computational grid 304 defined for predicting the behavior of the curable composition IM in the second simulation is larger than the number of computational components of the first computational grid 303 defined for predicting the behavior of the curable composition IM in the first simulation. Since an increase in the number of computational components of the computational grid leads to a rise in computational cost, it is difficult to set the simulation range to the region (the entire pattern region PR of the mold M) where the plurality of droplets of the curable composition IM are arranged on the substrate S.

The simulation method according to this embodiment predicts the behavior of the curable composition IM by combining the first simulation and the second simulation. In the first simulation, the entire pattern region PR of the mold M is set as the simulation range, and spreading of the droplets 302, the distribution of the gas confined between the droplets 302, the pressure distribution of the confined gas, and the like are computed. On the other hand, in the second simulation, the behavior of the curable composition IM is computed in more detail based on the result of the first simulation.

As has been described above, since the second simulation is a computation method whose computational cost is very high, it is not practical to set the entire pattern region PR of the mold M as the simulation range. Therefore, by limiting the simulation range 306 for executing the second simulation to a region where the behavior (spreading of the droplet 302) of the curable composition IM becomes specific, more specifically, a region where poor filling occurs, the computational cost is reduced. For example, the region near the mold-side mark 301 is set as the simulation range 306 for executing the second simulation.

The position of the mold-side mark 301 in the pattern region PR of the mold M can be obtained from the mold design file 202 including the design information of the mold M. Thus, the positional information of the mold-side mark 301 is extracted from the mold design file 202, and the second simulation is executed by limiting the simulation range 306 to the region near the position of the mold-side mark 301. Even if the fluidity of the droplet 302 arranged in a region away from the mold-side mark 301 is taken into consideration, the improvement in computational accuracy with respect to the computational cost required for it is small. Accordingly, limiting the simulation range 306 for executing the second simulation leads to a reduction in computational cost.

Figure 4:
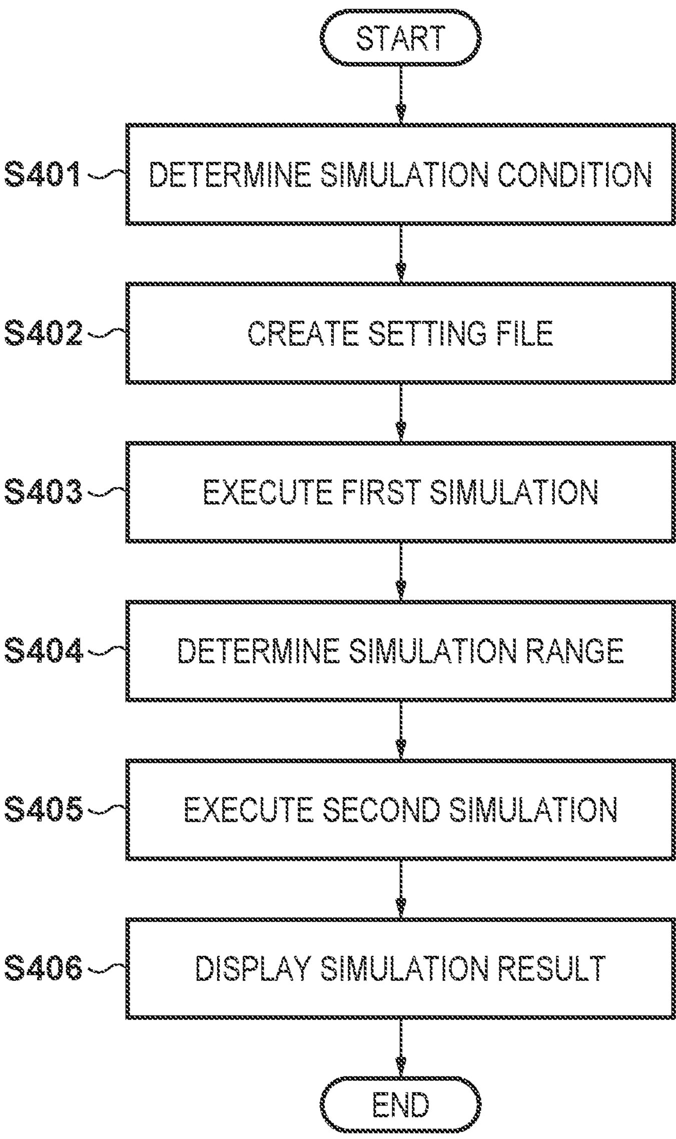
FIG. 4 is a flowchart for describing the simulation method according to the first embodiment.

With reference to FIG. 4, the simulation method according to the first embodiment will be described. In this embodiment, an example will be described in which the fillability of the curable composition IM in the mold-side mark 301 is predicted as the behavior of the curable composition IM.

In step S401, the simulation apparatus 1 determines a simulation condition. Here, information about the film forming apparatus IMP, the mold M, the substrate S, the dispenser DS, and the like is determined as the simulation condition. In order to reflect such the information on the setting file 201, it is checked if the information is already stored in the memory 20. If the information is not yet stored in the memory 20, the information is stored in the memory 20 via the input device 40.

In step S402, the simulation apparatus 1 creates the setting file 201. The setting file 201 created in step S402 is stored in the memory 20, and the simulation program 21 is executed. Further, in this embodiment, a computational mode of evaluating the fillability of the curable composition IM in the mold-side mark 301 is set in the setting file 201. In this computational mode, with reference to the coordinate information (positional information) of the mold-side mark 301 included in the mold design file 202, the simulation rang for executing the second simulation is set based on the coordinate information. The simulation program 21 is provided with a mechanism that optimizes the simulation setting by setting such a computational mode.

In step S403, the simulation apparatus 1 executes the first simulation (fourth step). Since the computational cost of the first simulation is low as described above, in this embodiment, the first simulation is executed aiming to grasp the behaviors of the droplets 302 in the entire pattern region PR of the mold M. Therefore, the first simulation is executed while setting the entire pattern region PR of the mold M as the simulation range. In the first simulation, overall spreading of the droplets 302, the distribution of bubbles confined between the droplets 302, and the like are computed (predicted). By referring to the result of the first simulation in the second simulation, the computational cost in the second simulation can be reduced. One of the reasons for setting the entire pattern region PR of the mold M as the simulation range for executing the first simulation is that the simulation range for executing the second simulation is uncertain at this time.

In step S404, the simulation apparatus 1 determines a simulation range for executing the second simulation. As has been described above, the second range for executing the second simulation for predicting the behavior of the curable composition IM with the second accuracy higher than the first accuracy, the second range being included in the first range for executing the first simulation for predicting the behavior of the curable composition IM with the first accuracy, is determined (first step). In this embodiment, since the computational mode of evaluating the fillability of the curable composition IM is set, with reference to the mold design file 202, the computation target region (the simulation range for executing the second simulation) of the mold-side mark 301 is displayed in the visual window 206.

Note that in this embodiment, the region including the mold-side mark 301 is determined as the simulation range for executing the second simulation, but it is also possible to determine the simulation range for executing the second simulation based on information about the substrate-side mark 305. By setting a computational mode targeting the substrate-side mark 305 in the setting file 201, it is possible to determine the simulation range for executing the second simulation with reference to the coordinate information (positional information) of the substrate-side mark 305 included in the substrate design file 203. The information to be referred to is not limited to the coordinate information of the substrate-side mark 305, and it is also possible to refer to information about other marks, patterns, and the like included in the substrate design file 203.

Alternatively, a computational mode of determining the simulation range for executing the second simulation based on the result of the first simulation may be set. In this embodiment, by executing the first simulation, the distribution of bubbles confined between the droplets 302 can be computed. Therefore, with reference to the result of the first simulation, for example, the number and sizes of the bubbles, the abnormal portion, more specifically, the region where pool filling occurs is specified, and the simulation range for executing the second simulation may be determined so as to include the specified region.

In this embodiment, the simulation range for executing the second simulation is determined only based on the information about the mold-side mark 301, but the present invention is not limited to this. For example, it is also possible to determine the simulation range for executing the second simulation not only based on the information about the mold-side mark 301 but also based on a combination with the information about the substrate-side mark 305 or the result of the first simulation.

Note that the simulation range for executing the second simulation may be automatically determined by the simulation program 21. The simulation range for executing the second simulation may be determined by adjusting, in accordance with a user input, the simulation range tentatively determined (proposed) by the simulation program 21. If the simulation range for executing the second simulation is automatically determined, the time to wait for a user input can be reduced, and this leads to an improvement in computational cost. If the simulation range for executing the second simulation is adjusted by the user, for example, the user can refer to the result of the first simulation so that a more appropriate range can be determined.

In step S405, the simulation apparatus 1 executes the second simulation in the simulation range determined in step S404 (second step). If the simulation range for executing the second simulation is automatically determined, it is unnecessary to manually set and adjust the simulation range, so the user need not care about steps S404 and S405. Therefore, further improvement of efficiency can be achieved in execution of the second simulation.

In step S406, the simulation apparatus 1 displays the result of the first simulation executed in step S403 or the result of the second simulation executed in step S405 in the visual window 206 (third step). In this embodiment, since the computational mode of evaluating the fillability of the curable composition IM in the mold-side mark 301 is set, the result of the second simulation is displayed in the visual window 206. Alternatively, the result of the first simulation may be displayed in the visual window 206 together with the result of the second simulation.

According to this embodiment, it is possible to optimally determine the simulation range for executing the second simulation whose computational cost is high. This can reduce the computational cost while maintaining the simulation accuracy. Further, it is possible to execute the simulation while minimizing user mistakes. In this manner, the simulation method according to this embodiment can implement maintaining the simulation accuracy and suppressing the computational cost.

Note that in this embodiment, an example has been described in which the simulation range for executing the second simulation is determined based on the design information of the mold M, but the present invention is not limited to this. For example, the simulation range may be determined based on at least one of the design information of the substrate S, the arrangement information of the plurality droplets of the curable composition IM, the positional information of the pattern region PR of the mold M, and the information about the result of the first simulation.

If the simulation range is determined based on at least one of the design information of the mold M, the design information of the substrate S, the arrangement information of the plurality of droplets of the curable composition IM, and the positional information of the pattern region PR of the mold M, steps S404 and S405 may be performed in parallel with step S403. Note that if steps S403, S404, and S405 are performed in this order, the simulation range may be tentatively determined based on the above-described information, and the tentatively determined simulation range may be adjusted based on the information about the result of the first simulation.

Second Embodiment

Figure 5:
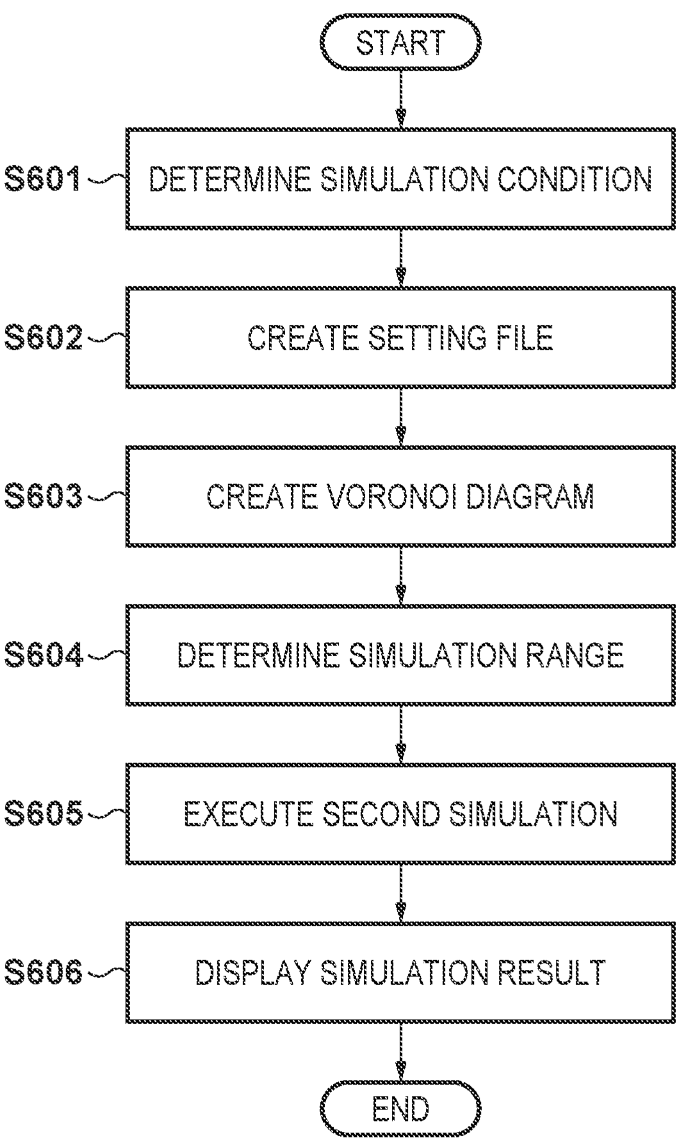
FIG. 5 is a flowchart for describing a simulation method according to the second embodiment.

With reference to FIG. 5, a simulation method according to the second embodiment will be described. In this embodiment, an example will be described in which oozing or unfilling of a curable composition IM in the edge portion of a pattern region PR of a mold M is predicted as the behavior of the curable composition IM. In this embodiment, the simulation range for executing the second simulation is determined using a droplet arrangement file 204. More specifically, a Voronoi diagram is created from the droplet arrangement file 204, and the density of the droplet (spreading thereof) of the curable composition IM is referred to.

In step S601, a simulation apparatus 1 determines a simulation condition. Step S601 is similar to step S401 shown in FIG. 4, and a detailed description thereof will be omitted here.

In step S602, the simulation apparatus 1 creates a setting file 201. In this embodiment, a computational mode of determining, based on the droplet area information and droplet positional information obtained from the Voronoi diagram, a simulation range for executing the second simulation is set in the setting file 201. In this computational mode, after the Voronoi diagram for the entire pattern region PR of the mold M is created, the simulation range for executing the second simulation is determined by limiting it to the droplets near the edge portion of the pattern region PR based on the positional information of the droplets of the curable composition IM.

In step S603, the simulation apparatus 1 creates the Voronoi diagram. Here, the Voronoi diagram is a diagram in which generating points are set at the positions of a plurality of droplets 302 arranged between the mold M and a substrate S, and region division is performed based on the generating points close to respective points in the pattern region PR of the mold M. Further, the Voronoi diagram is a diagram formed by the plurality of droplets 302 and regions corresponding to the respective droplets 302. Creating the Voronoi diagram corresponds to executing the first simulation described in the first embodiment (fourth step). Here, in order to grasp all the areas of the regions corresponding to the droplets 302 in the pattern region PR of the mold M, the Voronoi diagram is created for the entire pattern region PR. When creating the Voronoi diagram, coordinate information of the position where each droplet 302 is arranged and area information of the region corresponding to each droplet 302 are converted into numerical values and listed in a memory 20. The coordinate information and the area information are visualized as the Voronoi diagram to make it easier for a user to check the droplet arrangement via a visual window 206.

Figure 6:
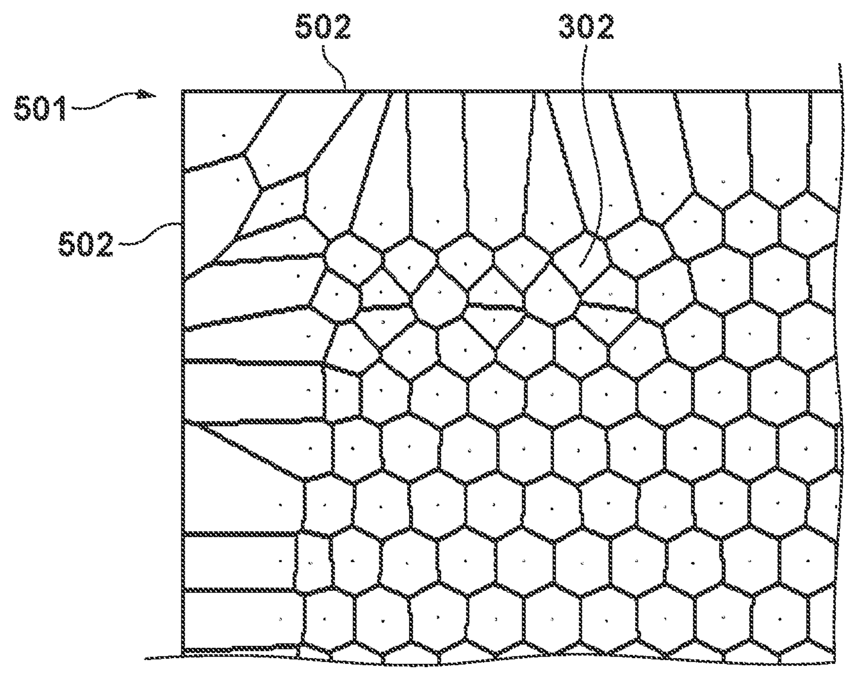
FIG. 6 is a view showing an example of a Voronoi diagram.

FIG. 6 is a view showing an example of a Voronoi diagram 501 created in step S603. The Voronoi diagram 501 is created based on the droplet arrangement information included in the droplet arrangement file 204. As has been described above, the Voronoi diagram 501 for the entire pattern region PR of the mold M is created in this embodiment, but an edge portion 502 (corner portion) of the pattern region PR is extracted and shown in FIG. 6.

The edge portion 502 is a portion that becomes an end portion of a film formed by the curable composition IM, that is, the outermost circumference of the pattern region PR of the mold M. Note that the coordinate information of the edge portion 502 can be obtained by referring to a mold design file 202 or a substrate design file 203.

From the Voronoi diagram 501, it is possible to predict the spreading region of each of the plurality of droplets 302, and grasp the density of the droplet 302. Referring to FIG. 6, the arrangement of the droplet 302 is sparse in the region of a large area, and the arrangement of the droplet 302 is dense in the region of a small area. Normally, the discharge amount of the droplet 302 from a dispenser DSP is constant. Accordingly, the height of the droplet 302 becomes high in the region of a small area, and the height of the droplet 302 becomes low in the region of a large area. Further, unfilling of the curable composition IM is concerned in the region of a large area, and oozing of the curable composition IM is concerned in the region of a small area. Therefore, by executing the second simulation in the portion where the area of the droplet 302 is extremely different from areas of other droplets, the computational cost can be suppressed.

In step S604, the simulation apparatus 1 determines a simulation range for executing the second simulation (first step). In this embodiment, by comparing the Voronoi diagram 501 (the density of the droplet 302) created in step S603 with the list stored in the memory 20, a portion near the end portion 502 of the pattern region PR of the mold M is determined as the simulation range for executing the second simulation. The simulation range determined in step S604 is displayed in the visual window 206, and a user can check the simulation range for executing the second simulation via the visual window 206. The simulation range displayed in the visual window 206 may be adjustable in accordance with a user input.

In step S605, the simulation apparatus 1 executes the second simulation in the simulation range determined in step S604 (second step).

In step S606, the simulation apparatus 1 displays, in the visual window 206, the result of the second simulation executed in step S605 (third step). In this embodiment, a portion where oozing or unfilling of the curable composition IM has occurred with respect to the edge portion 502 of the pattern region PR of the mold M is displayed in the visual window 206.

According to this embodiment, it is possible to optimally determine the simulation range for executing the second simulation whose computational cost is high. This can reduce the computational cost while maintaining the simulation accuracy. Further, it is possible to execute the simulation while minimizing user mistakes. In this manner, the simulation method according to this embodiment can implement maintaining the simulation accuracy and suppressing the computational cost.

Third Embodiment

Figure 7:
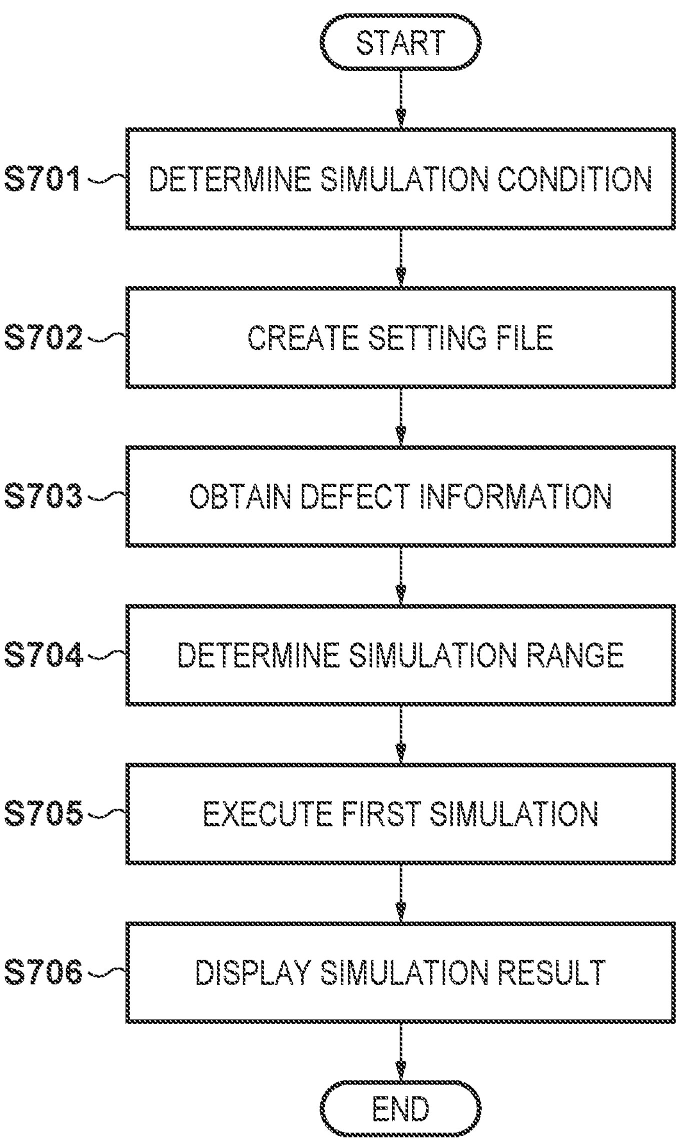
FIG. 7 is a flowchart for describing a simulation method according to the third embodiment.

With reference to FIG. 7, a simulation method according to the third embodiment will be described. In this embodiment, by using a microscope which is an external measurement apparatus, the position of a defect such as a bubble generated in a film of a curable composition IM formed on a substrate S via an imprint process is specified. Then, based on the specified position, the first simulation is executed in a portion where many defects have occurred.

In step S701, a simulation apparatus 1 determines a simulation condition. Step S701 is similar to step S401 shown in FIG. 4, and a detailed description thereof will be omitted here.

In step S702, the simulation apparatus 1 creates a setting file 201. In this embodiment, a computational mode of determining a simulation range for executing the first simulation based on defect information to be described later is set in the setting file 201. In this manner, in this embodiment, it is important that the imprint condition at the time of forming the film of the curable composition IM on the substrate S is reflected on the setting file 201.

In step S703, the simulation apparatus 1 obtains the defect information indicating the position of a defect having occurred in the film of the curable composition IM formed on the substrate S. The defect information is information about the measurement result of the film of the curable composition IM formed by executing the imprint process. For example, the defect information is obtained by measuring, using the microscope, the film of the curable composition IM formed on the substrate S. At this time, the area and coordinate information of the defect are listed and stored in a memory 20. The listing is performed for an entire pattern region PR of a mold M.

In step S704, the simulation apparatus 1 determines a simulation range for executing the first simulation. In this manner, the second range (the range including the portion where the defect has occurred) for executing the first simulation for predicting the behavior of the curable composition IM, the second range being included in the first range (the entire pattern region PR of the mold M) and smaller than the first range, is determined (first step). In this embodiment, by comparing the defect information obtained in step S703 with the list stored in the memory 20, a portion where the defect has occurred is determined as the simulation range for executing the first simulation. In this embodiment, the setting file 201 is set such that the first simulation is executed without displaying the above-described information in a visual window 206. Accordingly, the simulation range is automatically determined in accordance with a simulation program 21 without adjustment of the simulation range by a user, and the first simulation is automatically started. Therefore, further improvement of efficiency can be achieved in execution of the first simulation. In addition, if the portion where the defect has occurred is a limited region, it is unnecessary to execute the first simulation in the entire pattern region PR of the mold M, so that the simulation range can be limited. This can reduce the computational cost.

In step S705, the simulation apparatus 1 executes the first simulation in the simulation range determined in step S704 (second step).

In step S706, the simulation apparatus 1 displays the result of the first simulation executed in step S705 in the visual window 206 (third step). In this embodiment, information about the portion where the defect has occurred is displayed in the visual window 206 as the behavior of the curable composition IM. In this embodiment, it is possible to relatively compare the defect information obtained by the microscope with the result of the first simulation. Therefore, it becomes easier to specify the cause of the defect.

As has been described above, in this embodiment, the simulation range for executing the first simulation is determined based on the information about the measurement result of the film of the curable composition IM formed by executing the imprint process. With this, the simulation range for executing the first simulation can be adequately determined within the range suitable for the purpose. This can reduce the computational cost while maintaining the simulation accuracy. Further, it is possible to execute the simulation while minimizing user mistakes. In this manner, the simulation method according to this embodiment can implement maintaining the simulation accuracy and suppressing the computational cost.

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

The film forming apparatus IMP incorporating the simulation apparatus 1 controls, based on prediction of the behavior of the curable composition performed by the simulation apparatus 1, a process of bringing the curable composition arranged on the first member into contact with the second member and forming a film of the curable composition.

An article manufacturing method according to the present invention includes a step of determining, while repeating the simulation method described above, a condition for a process of bringing the curable composition arranged on the first member into contact with the second member and forming a film of the curable composition, and a step of executing the process in accordance with the condition. So far, a mode in which the mold includes a pattern has been described, but the present invention is also applicable to a mode in which a substrate includes a pattern.

FIG. 8A to FIG. 8F show a more specific example of a method of manufacturing an article. As illustrated in FIG. 8A, the substrate such as a silicon wafer with a processed material such as an insulator formed on the surface is prepared. Next, an imprint material (curable composition) is applied to the surface of the processed material by an inkjet method or the like. A state in which the imprint material is applied as a plurality of droplets onto the substrate is shown here.

As shown in FIG. 8B, a side of the mold for imprint with a projection and groove pattern is formed on and caused to face the imprint material on the substrate. As illustrated in FIG. 8C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

As shown in FIG. 8D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

As shown in FIG. 8E, when etching is performed using the pattern of the cured product as an etching resistant mask, a portion of the surface of the processed material where the cured product does not exist or remains thin is removed to form a groove. As shown in FIG. 8F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

The present invention is not limited to the above embodiments and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-128507 filed on Jul. 29, 2020, which is hereby incorporated by reference herein in its entirety.

What is claimed is:

1. A method of forming an actual film of a curable composition in a film forming apparatus that brings a plurality of droplets of the curable composition arranged on a first member into contact with a second member to form the actual film of the curable composition in a space between the first member and the second member, the method comprising:

determining a second range that is a target range of a second simulation, the second range including a second region of the space between the first member and the second member, and the second simulation being a simulation that, when executed, predicts a behavior of the curable composition in the second region with a second accuracy;

executing the second simulation in the second range to predict the behavior of the curable composition in the second region of the space between the first member and the second member with the second accuracy;

displaying a result of the second simulation; and causing the film forming apparatus to form the actual film of the curable composition in the space between the first member and the second member according to the result of the second simulation, wherein in the determining, the second range is determined based on at least information about a result of a first simulation executed in a first range that includes a first region of the space between the first member and the second member that is greater in size than the second region of the space between the first member and the second member, the first simulation being a simulation that, when executed, predicts a behavior of the curable composition in the first region with a first accuracy lower than the second accuracy.

2. The method according to claim 1, wherein in the determining, based on the at least information about the result of the first simulation, a region where poor filling occurs in a region where the plurality of droplets of the curable composition is arranged on the first member is specified, and the second range is determined so as to include the region where the poor filling occurs.

3. The method according to claim 1, further comprising executing the first simulation in the first range prior to the determining.

4. The method according to claim 3, wherein in the displaying, a result of the first simulation is also displayed.

5. The method according to claim 1, wherein the determining further includes tentatively determining the second range based on at least one piece of information among design information of the first member, design information of the second member, arrangement information of the plurality of droplets of the curable composition, and positional information of a contact surface of the second member that contacts the plurality of droplets of the curable composition, and the second range is determined by adjusting the tentatively determined second range based on the information about the result of the first simulation.

6. The method according to claim 1, wherein the determining further includes tentatively determining the second range based on at least one piece of information among design information of the first member, design information of the second member, arrangement information of the plurality of droplets of the curable composition, positional information of a contact surface of the second member that contacts the plurality of droplets of the curable composition, and the information about the result of the first simulation executed in the first range, and the second range is determined by adjusting the tentatively determined second range in accordance with a user input.

7. The method according to claim 1, wherein a number of computational components, in the second region of the space between the first member and the second member, of a computational grid defined for predicting the behavior of the curable composition in the second simulation is larger than a number of computational components, in the second region of the space between the first member and the second member, of a computational grid defined for predicting the behavior of the curable composition in the first simulation.

8. The method according to claim 1, wherein a computational load for executing the second simulation is larger than a computational load for executing the first simulation.

9. The method according to claim 1, wherein first region of the space between the first member and the second member corresponds to an entire pattern region of the second member.

10. The method according to claim 1, wherein the second region of the space between the first member and the second member is included within the first region of the space between the first member and the second member.

11. The method according to claim 1, wherein the second region of the space between the first member and the second member includes a region of a mark formed in the first member.

12. The method according to claim 1, wherein the second region of the space between the first member and the second member includes a region of a mark formed in the second member.

13. A non-transitory storage medium storing a program for causing a computer to execute the method defined in claim 1.

14. A method of forming an actual film of a curable composition in a film forming apparatus that brings a plurality of droplets of the curable composition arranged on a first member into contact with a second member to form the actual film of the curable composition in a space between the first member and the second member, the method comprising:

determining a second range that is a target range of a simulation, the second range including a second region of the space between the first member and the second member, and the simulation being a simulation that, when executed, predicts a behavior of the curable composition in the second region of the space between the first member and the second member;

executing the simulation in the second range to predict the behavior of the curable composition in the second region of the space between the first member and the second member;

displaying a result of the simulation; and causing the film forming apparatus to form the actual film of the curable composition in the space between the first member and the second member according to the result of the simulation, wherein in the determining, the second region of the space between the first member and the second member is determined as the second range for executing the simulation based on information about an actual measurement result of another actual film of the curable composition previously formed by the film forming apparatus.

15. The method according to claim 14, wherein the information about the actual measurement result of the another actual film of the curable composition previously formed by the film forming apparatus includes defect information indicating a position of a defect in the another actual film, and the second region of the space between the first member and the second member, determined as the second range for executing the simulation, corresponds to the position of the defect in the another actual film.

16. An apparatus that forms an actual film of a curable composition by bringing a plurality of droplets of the curable composition arranged on a first member into contact with a second member to form the actual film of the curable composition in a space between the first member and the second member, the apparatus comprising:

(i) one or more memories configured to store computer-executable instructions and one or more processors configured to execute the computer-executable instructions stored in the one or more memories, (ii) one or more circuits, or both (i) and (ii) that cause the apparatus to:

determine a second range that is a target range of a second simulation, the second range including a second region of the space between the first member and the second member, and the second simulation being a simulation that, when executed, predicts a behavior of the curable composition in the second region with a second accuracy, execute the second simulation in the second range to predict the behavior of the curable composition in the second region of the space between the first member and the second member with the second accuracy, display a result of the second simulation, and cause the apparatus to form the actual film of the curable composition in the space between the first member and the second member according to the result of the second simulation, wherein the second range is determined based on at least information about a result of a first simulation executed in a first range that includes a first region of the space between the first member and the second member that is greater in size than the second region of the space between the first member and the second member, the first simulation being a simulation that, when executed, predicts a behavior of the curable composition in the first region with a first accuracy lower than the second accuracy.

17. An apparatus that forms an actual film of a curable composition by bringing a plurality of droplets of the curable composition arranged on a first member into contact with a second member to form the actual film of the curable composition in a space between the first member and the second member, the apparatus comprising:

(i) one or more memories configured to store computer-executable instructions and one or more processors configured to execute the computer-executable instructions stored in the one or more memories, (ii) one or more circuits, or both (i) and (ii) that cause the apparatus to:

determine a second range that is a target range of a simulation, the second range including a second region of the space between the first member and the second member, and the simulation being a simulation that, when executed, predicts a behavior of the curable composition in the second region of the space between the first member and the second member, execute the simulation in the second range to predict the behavior of the curable composition in the second region of the space between the first member and the second member, display a result of the simulation, and cause the apparatus to form the actual film of the curable composition in the space between the first member and the second member according to the result of the simulation, wherein the second region of the space between the first member and the second member is determined as the second range for executing the simulation based on information about an actual measurement result of another actual film of the curable composition previously formed by the apparatus.

* * * * *